United States Patent [19]

Weckler

[11] 4,157,558

[45] Jun. 5, 1979

[54] BUCKET-BRIGADE CHARGE TRANSFER MEANS FOR FILTERS AND OTHER APPLICATIONS

[75] Inventor: Gene P. Weckler, Campbell, Calif.

[73] Assignee: Reticon Corporation, Sunnyvale, Calif.

[21] Appl. No.: 901,566

[22] Filed: May 1, 1978

Related U.S. Application Data

[63] Continuation of Ser. No. 687,370, May 17, 1976, abandoned, which is a continuation-in-part of Ser. No. 614,655, Sep. 18, 1975, abandoned.

[51] Int. Cl.² .............. H01L 29/78; G11C 19/28; H01L 29/04; H03H 7/28
[52] U.S. Cl. ............................. 357/24; 307/221 D; 357/59; 333/167
[58] Field of Search ............... 357/24; 307/221 D; 333/70 T

[56] References Cited

U.S. PATENT DOCUMENTS

| 3,737,683 | 6/1973 | Sangster | 357/24 |
|---|---|---|---|
| 3,745,383 | 7/1973 | Sangster | 357/24 |
| 3,767,983 | 10/1973 | Berglund | 357/24 |
| 3,789,267 | 1/1974 | Krambeck et al. | 357/24 |
| 3,809,923 | 5/1974 | Esser | 307/221 D |
| 3,838,438 | 9/1974 | Silversmith | 357/24 |
| 3,897,282 | 7/1975 | White | 357/24 |
| 3,918,081 | 11/1975 | Sangster | 357/24 |
| 3,935,439 | 1/1976 | Buss et al. | 357/24 |

FOREIGN PATENT DOCUMENTS

2508833 9/1975 Fed. Rep. of Germany ............ 357/24

OTHER PUBLICATIONS

White et al., "CCD and MNOS Devices for Programmable Analog Signal Processing . . ." IEEE Int. Electron Devices Meeting (12/73) Tech. Dig., pp. 130-133.
Sequin et al., *Charge Transfer Devices*, Academic Press, N.Y. (7/75), pp. 24-32, 91-97, 110, 111.
Sangster, "Integrated Bucket-Brigade Delay Line Using MOS Tetrode" Philips Technical Review, vol. 31 (1970), p. 266.
Berglund et al., "Performance Limitations of the IGFET Bucket-Brigade Shift Register" IEEE Trans. Electron Devices, vol. ED-19 (7/72), pp. 852-860.

*Primary Examiner*—William D. Larkins
*Assistant Examiner*—Gene M. Munson
*Attorney, Agent, or Firm*—Blakely, Sokoloff, Taylor & Zafman

[57] ABSTRACT

An MOS bucket-brigade device (BBD) fabricated with two layers of polycrystalline silicon is disclosed. Each stage includes a pair of spaced-apart regions, one of which is formed in a well. A holding stage is employed which includes a lightly doped substrate region which reduces junction capacitance.

5 Claims, 7 Drawing Figures

BUCKET-BRIGADE CHARGE TRANSFER MEANS FOR FILTERS AND OTHER APPLICATIONS

This is a continuation of Ser. No. 687,370, filed May 17, 1976, now abandoned, which is a continuation-in-part of Ser. No. 614,655, filed Sept. 18, 1975, now abandoned. A continuation-in-part of Ser. No. 687,370, Ser. No. 710,596, was filed on Aug. 2, 1976, and issued as U.S. Pat. No. 4,100,513 on July 11, 1978.

BACKGROUND OF THE INVENTION

1. Field of the Invention

The invention relates to the field of semiconductor filters, correlating means and recursive filters particularly employing integrated circuits.

2. Prior Art

In general, there has been a recognition of the benefits of semiconductor (integrated circuit) transversal and recursive filters. Such filters permit easy correlations (or convolution) between signals, and permit computation of time-invariant linear transforms. Among some of the specific suggested applications for such filters are: (1) determination of complex linear chirps for performing the discrete Fourier or cosine transforms by the Chirp-Z-transform algorithm, (2) broadband phase shifting for single sideband systems, and (3) broadband differentiators and integrators for synthesizing sampled data control loops, in addition to countless other signal processing problems. See "Signal Processing Architectures Using Transversal Filter Technology", by Whitehouse, Means and Speiser (Naval Underwater Center), Symposium on Circuits and Systems, 1975; and "The Serial Analog Processor" by Gene P. Weckler (Reticon Corporation), *ISSCC 75*, (Feb. 13, 1975).

Two general approaches have been employed for such filters or correlators. In one, an analog signal is stored while weighted taps are moved past the stored (static) signal. In the other approach, an analog signal is moved past fixed (weighted) taps. This latter approach permits real-time processing of an input signal.

In filters or correlators which employ a "moving" analog signal, most typically charge-coupled devices (CCD) or bucket-brigade devices (BBD), are used to transfer charge representing the input (analog signal). BBD may be realized as integrated circuits with both bipolar and MOS technology, and CCD may be realized with MOS technology. However, one major problem in obtaining a practical system has been the problem of providing a high impedance, weighted tap, to non-destructively sense the "moving" analog signal in a CCD or BBD register. The prior art solutions to this problem have, at best, one of the following shortcomings: (1) sensitive to normal semiconductor process variations such as oxide thicknesses, mask misalignment, etc. (2) require generation of special masks for each correlating function or signal, or (3) use expensive, non-integrated, discrete components. See "Bucket-Brigade Transversal Filter" by Puckette, Butler and Smith, *IEEE Transactions on Circuits and Systems*, Vol. CAS-21, No. 4, July 1974 (pages 502–510) for a discussion of "on chip" tap weights; also see "Transversal Filtering Using Charge-Transfer Devices: by Buss, Collins, Bailey and Reeves, *IEEE Journal of Solid-State Circuits*, Vol. Sc-8, No. 2, April, 1973 (pages 138–146). The techniques described in these articles include electrode weighting (split electrode) for CCD, weighted capacitors, and a transconductance technique.

Digital weighting of the outputs from a plurality of filters has been disclosed, see *Charge Transfer Devices* by Sequin and Tompett, published by Academic Press, Inc. (1975), Pages 230–231.

As will be seen, the present invention in its preferred embodiment, employs a novel bucket-brigade register for moving an input analog signal past taps which are easily (electrically) programmed. The summed or differenced output associated with each set of programmed taps is weighted, thereby permitting a highly resolved output signal in one embodiment to provide a transversal filter. For the most part, the filter is fabricated on a single MOS chip.

SUMMARY OF THE INVENTION

A bucket-brigade charge transfer means disposed on a silicon substrate of a first conductivity type which includes a plurality of stages is disclosed. Each stage includes a first and second spaced-apart regions of a second conductivity type having a p-n junction. A third region of the second conductivity type is included in the substrate spaced-apart from the first and second regions; this third region is more lightly doped than the first and second regions. A first gate is disposed above the substrate generally between the first and second regions. A second gate is also disposed above the substrate generally between the second and third regions. The stage also includes a member disposed above the third region which is coupled to the second gate; this member and third region form a capacitor. A fourth region is disposed in the substrate below the first and second gates and surrounds the p-n junction of the second region; this fourth region is more heavily doped with the first conductivity type dopant than the substrate. Each stage also includes contact means for contacting the first region to permit sensing of charge in this region. In this manner, by the application of potentials to the first and second gates, charge may be transferred in the bucket-brigade charge transfer means.

DETAILED DESCRIPTION OF THE INVENTION

A semiconductor filter or correlator is disclosed which permits discrete time correlation or convolution of an analog input signal with a correlating signal and which may also be employed as a recursive filter. As presently described, the correlating signal is in binary form; however, as will be appreciated, an analog correlating signal may be utilized and readily converted to digital form. Moreover, while an analog input signal is employed for purposes of discussion, it will also be appreciate that other types of input signals may be utilized.

Figure 1:
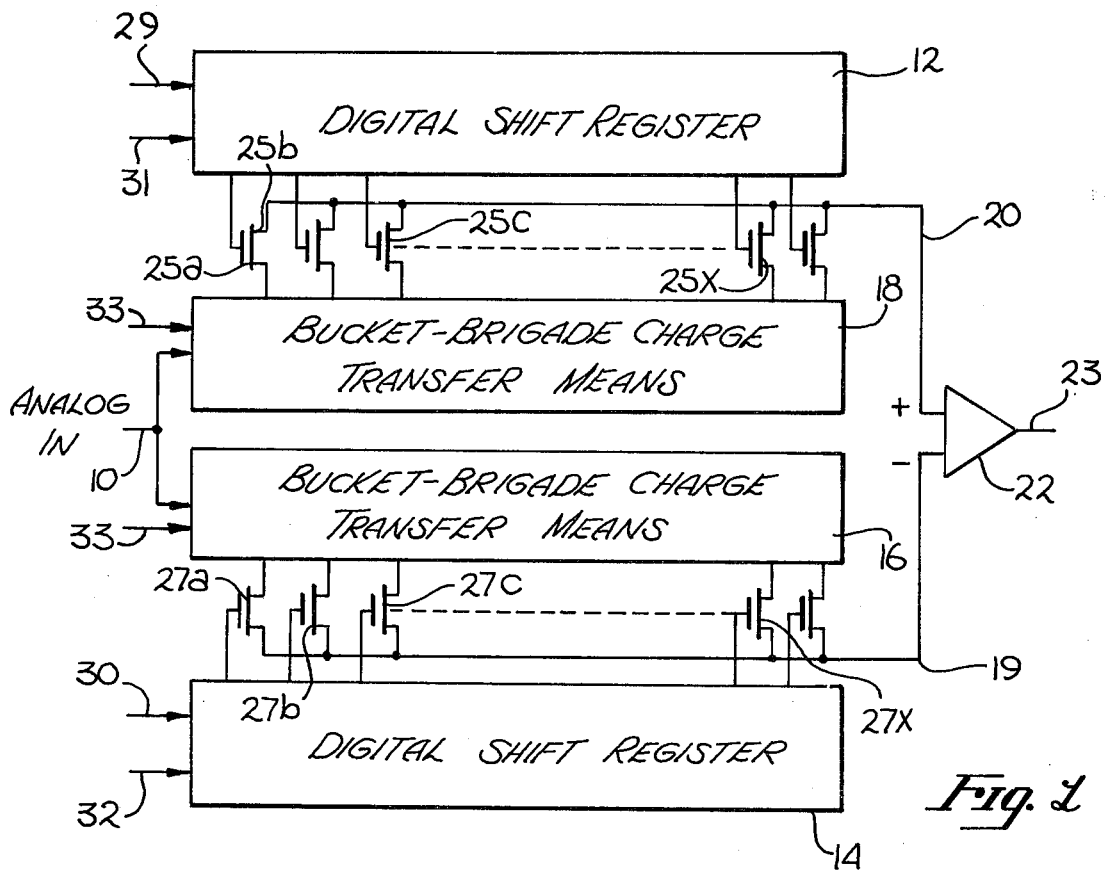
FIG. 1 is a block diagram illustrating one embodiment of the present invention wherein the taps of a bucket-brigade charge transfer means are programmed through the use of a shift register.

In FIG. 1, an embodiment of the invention is illustrated wherein a digital shift register such as a static shift register is used for purposes of programming the readout from taps of a bucket-brigade charge transfer means. Two digital shift registers 12 and 14 are illustrated. These registers may be ordinary shift registers. These digital shift registers 12 and 14 receive the correlating signal on lines 29 and 30, respectively. Lines 31 and 32 are shown to illustrate the input timing signals typically used for transferring the digital information along the registers 12 and 14. As presently implemented, the digital shift registers 12 and 14 are MOS, static shift registers.

Associated with each of the registers 12 and 14 is a bucket-brigade charge transfer means, such as means 18, which is coupled to register 12, and means 16, which is coupled to register 14. The bucket-brigade charge transfer means 16 and 18 receive the same input signal on line 10, and transfer this signal (in the form of charge) along the transfer means 16 and 18. Any one of a plurality of known bucket-brigade charge transfer means may be employed, however, a specific embodiment of a bucket-brigade charge transfer means shall be described, in detail, in conjunction with FIGS. 3, 4 and 5. Line 33 receives timing signals for purposes of transferring charge along the transfer means 16 and 18.

It is assumed for purposes of explanation for the embodiment of FIG. 1, that each of the transfer means 16 and 18 includes a plurality of taps at which charge transferred along these means may be non-destructively sensed. Each of these taps is coupled to one terminal of a field-effect transistor. Specifically referring to means 18, transistor 25a has one of its terminals coupled to a tap of transfer means 18 and the other of its terminals coupled to an output line 20. In a similar manner, the field-effect transistors 25b and 25c have one of their terminals coupled to taps of transfer means 18, and the other of their terminals coupled to the output line 20. Similarly, a field-effect transistor couples each of the taps of transfer means 18 to the output line 20. The bucket-brigade charge transfer means 16 has each of its taps coupled to the output line 19 through a field-effect transistor, such as field-effect transistors 27a, 27b, and so forth.

The output line 20 is coupled to the positive input terminal of a differential amplifier 22, while the output line 19 is coupled to the negative input terminal of differential amplifier 22. The output of amplifier 22 is shown as line 23.

The gates of each of the transistors 25 is coupled to a stage of the digital shift register 12. It is assumed for purposes of explanation that if a binary one is stored within the first stage of the register 12, then a potential will be applied to the gate of the field-effect transistor 25a, causing that transistor to conduct; if a binary zero is contained within the second stage of the digital shift register 12, transistor 25b will not conduct. Similarly, the gates of the field-effect transistors 27 are coupled to the stages of the digital shift register 14.

The filter of FIG. 1 in its simplest form may be utilized as a variable length analog shift register. Assume for purposes of discussion that a single binary one is placed within register 12, while all other bits within the register are binary zeros. The input analog signal applied to line 10 may then be sensed with a time delay. This time delay is a function of the position of the binary one within register 12. It is apparent that a variable delay may be achieved by repositioning the binary one within register 12. Also, by adjusting the clock rates used to drive the register 12 and the transfer means 18, it is possible to shift the input frequency either to a higher or lower frequency, thus facilitating pitch control. For purposes of correlation, any desired bit pattern representing a correlating signal may be placed into registers 12 and 14, thereby activating the desired taps along the transfer means 16 and 18. The output signal on lines 19 and 20 will then be a function of this correlating signal. The signals on the output lines 19 and 20 represents the correlation of the input signal and correlating signal since the signals sensed at each of the taps for a given transfer means is summed on the respective output line 19 or 20. Note that since the output line 19 is coupled to the negative terminal of the differential amplifier 22, both a positive and negative correlating signal or other function may be employed.

Figure 2:
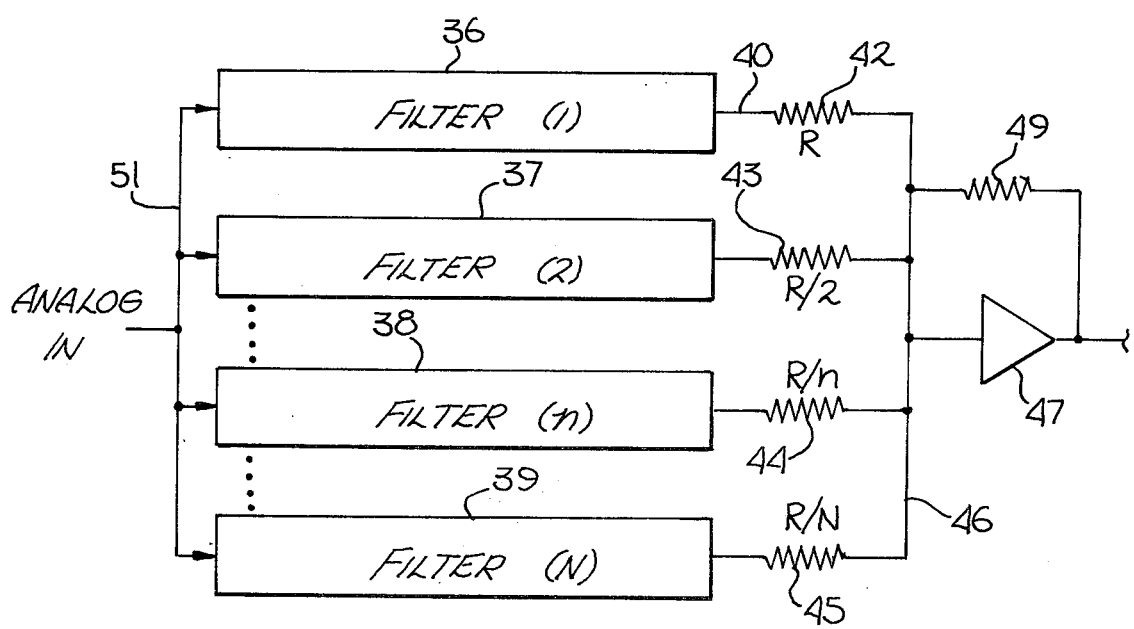
FIG. 2 is a block diagram illustrating the use of a plurality of filters where the output of these filters are weighted.

Referring now to FIG. 2, the filter of FIG. 1 is shown as filter 36; other filters such as the one shown in FIG. 1 are also shown as filters 37, 38 and 39. The output of the filter of FIG. 1 (line 23) is shown for filter 36 as line 40. The input analog signal line, line 10 of FIG. 1, is shown as line 51 in FIG. 2; this line is coupled to each of the filters 37, 37, 38 and 39. The various timing signals, and other control lines shown in conjunction with FIG. 1, are not illustrated in FIG. 2 in order not to complicate FIG. 2. Each of the outputs from each of the filters of FIG. 2 is applied through a weighting resistor, such as resistors 42, 43, 44 and 45 to the input terminal (line 46) of an amplifier 47. A feedback resistor 49 is shown coupled from the output of amplifier 47 to the input of the amplifier. The output of each filter (after passing through its respective weighting resistor) is summed on line 46.

Through use of the resistors 42 through 45, the output of each of the filters may be weighted, thereby allowing the correlating signal to be accurately defined. For example, resistor 42 is shown as having a value R, while resistor 43 is shown as having a valve R/2. The output from filter 38 is coupled to resistor 44 shown as having a value of R/n, while the remaining filter is coupled to line 46 through resistor 45 which resistor has a value of R/N. With the plurality of filters shown in FIG. 2, the correlating signal may be digitized with each sample or value of the correlating signal represented by N bits. The most significant bits of the correlating bits are stored within filter 39 and the least significant bits are stored in register 36. With this arrangement, the correlating signal may be defined with more accuracy by increasing the number (N) of filters. As will be seen, the use of a plurality of filters is utilized not only with the embodiment illustrated in FIG. 1, but also with the embodiment to be described in conjunction with FIGS. 3, 4 and 5.

Figure 3:
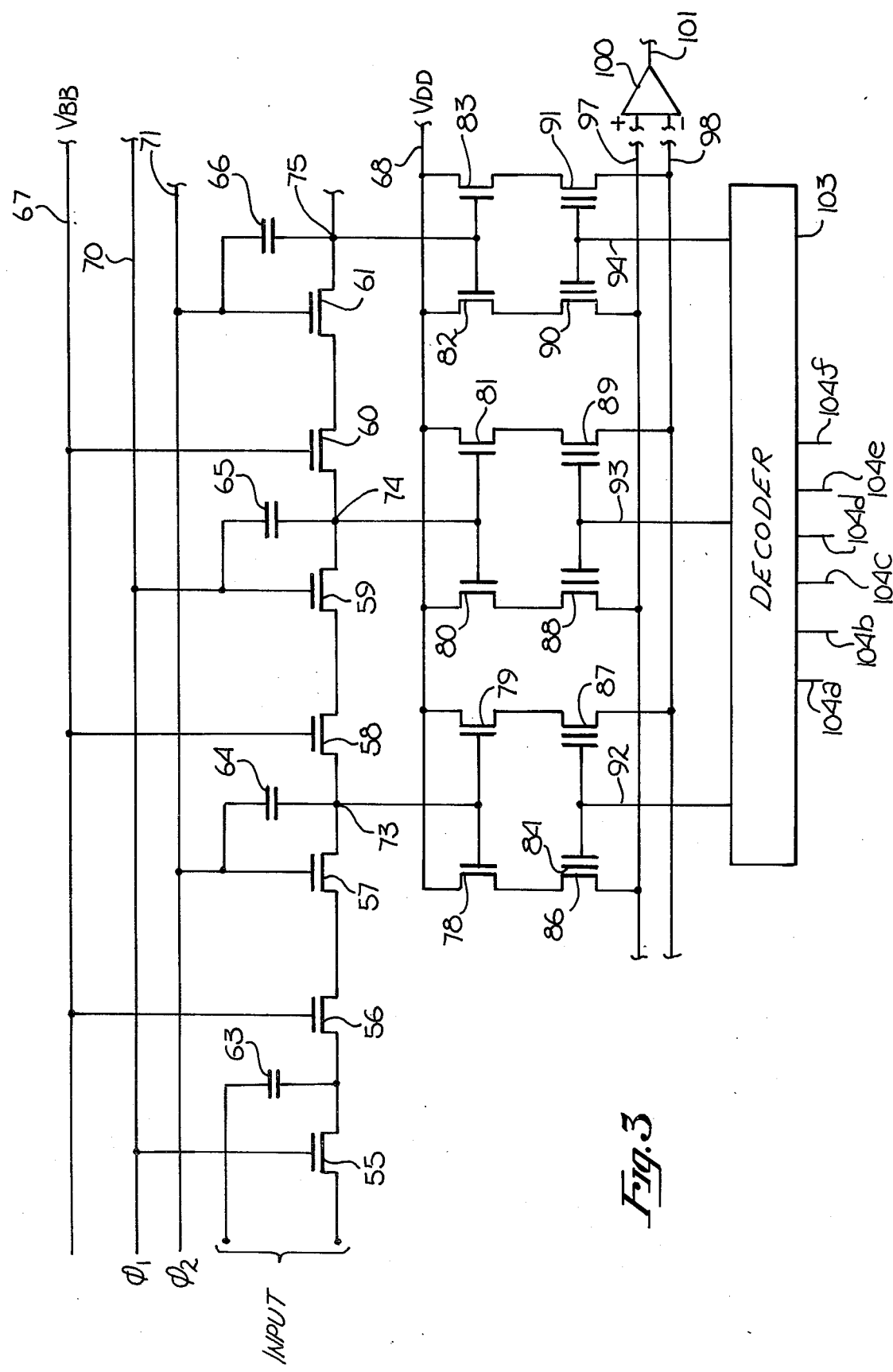
FIG. 3 is a circuit diagram illustrating a portion of the presently preferred bucket-brigade charge transfer means, the readout transistors coupled to taps along the bucket-brigade transfer means, the programmable devices used to select the various taps along the bucket-brigade transfer means and other circuitry.

Referring to FIG. 3, a portion of the presently preferred embodiment for a bucket-brigade charge transfer means is illustrated along with the readout transistors and programmable devices which allow the filter of FIG. 3 to be electrically programmed. The input signal to the filter, and in particular to the transfer means of FIG. 3, is applied to one terminal of capacitor 63 and to the drain terminal of an MOS field-effect transistor 55. The other terminal of capacitor 63 is coupled to the source terminal of transistor 55, and the drain terminal of transistor 56. Transistors 55, 56, 57, 58, 59, 60 and 61 are all coupled in series along the bucket-brigade transfer means.

The transistors 56, 58 and 60 are part of the transfer stages of the bucket-brigade; their gates are coupled to the source of a positive potential $V_{BB}$, line 67. These devices are employed to present surface potential modulation. The other part of the transfer stages (transistors 55, 57, 59 and 61) of the bucket-brigade have their gates alternately coupled to lines 70 and and 71. Line 70 receives the $\phi_1$ timing signal, while line 71 receives the complementary $\phi_2$ timing signal. The signal on line 70 is coupled to the gates of transistors 55 and 59, while the signal on line 71 is coupled to the gates of transistors 57 and 61.

A holding stage is disposed between each transfer stage in the bucket-brigade, each of these stages comprises a bootstrap capacitor which is defined by a lightly doped n-type region in the substrate and a polycrystalline silicon gate-like member disposed above, and insulated from, the substrate. These bootstrap capacitors are shown as capacitors 63, 64, 65 and 66 in FIG. 3. The lightly doped n-type regions for capacitors 64 and 65 are shown as regions 109 and 112, respectively in FIG. 4.

The readout nodes or taps of the transfer means are shown as nodes or taps 73, 74 and 75. Tap 73 is coupled to the gate of transistor 57 through the bootstrap capacitor 64, similarly tap 74 is coupled to the gate of transistor 59 through the boostrap capacitor 65, and tap 75 is coupled to the gate of transistor 61 through the bootstrap capacitor 66.

As will be appreciated, the transfer means may be of any desired length, and in the presently preferred embodiment 64 taps are employed. The input signal, applied to the input terminals of the transfer means, will be moved along the transfer means in the form of charge in an ordinary manner, and at a rate determined by the timing signals applied to lines 70 and 71. In the presently preferred embodiment, as mentioned, holding stages are employed in the transfer means. These stages, in addition to providing other advantages, eliminate the stringent waveform requirements for the timing signals applied to lines 70 and 71 associated with some prior art bucket-brigade charge transfer means.

Non-destructive readout from the bucket-brigade charge transfer means is accomplished from each tap through a pair of field-effect transistors which have their gates coupled to such taps. Specifically, tap 73 is coupled to the gates of field-effect transistors 78 and 79, tap 74 is coupled to the gates of transistors 80 and 81, and tap 75 is coupled to the gates of transistors 82 and 83. The drain terminals of transistors 78, 79, 80, 81, 82 and 83 are coupled to a source of positive potential $V_{DD}$, line 68. These readout transistors couple the taps (through the programmable devices) to a readout or output line such as lines 97 and 98. The signal on these lines is substantially equal to the sum of the signals sensed at all of the taps connected to a given readout or output line. The source terminals of each of these readout transistors is coupled to one terminal of a programmable floating gate device; for example, the source terminal of transistor 78 is coupled to one terminal of device 86, and, in a similar manner, the transistors 79, 80, 81, 82 and 83 are coupled to one terminal of devices 87, 88, 89, 90 and 91, respectively. The other terminal of device 86 is coupled to the readout line 97, while the other terminal of device 87 is coupled to a readout line 98. Similarly, the other terminals of devices 87 and 89 are coupled to readout line 97, while the other terminals of devices 89 and 90 are coupled to readout line 98. Each of the devices has its control gate coupled to a decoder 103. The control gates of devices 86 and 87 are coupled by line 92 to decoder 103, and, in a similar manner, the control gates of devices 88 and 89 are coupled by line 93 to decoder 103, and the control gates of devices 90 and 91 are coupled by line 94 to the decoder 103.

The decoder 103 receives address signals (during programming) on lines 104a through 104f, decodes these signals, and then provided a positive signal to the selected line such as line 92. In the presently preferred embodiment, where 64 programmable taps are employed, the decoder provides a signal to one of 64 lines, such as lines 92, 93 and 94, as a function of the address signal applied to lines 104a through 104f.

The programmable floating gate devices, such as devices 86, 87, 88, 89, 90 and 91 are known in the art, and have been utilized as storage cells in read-only memories. Each of these devices are disposed on the substrate which includes the transfer means, readout transistors and decoder. However, these devices are fabricated on a region of the substrate which is ion implanted; these ion implanted regions form the host material for the programmable devices. In the presently preferred embodiment, a p-type substrate is utilized, and the host regions for the programmable devices are ion implanted (boron-implanted) to a dopant level of approximately 2 to $5 \times 10^{16}$ atoms per cubic centimeter. This dopant level is an order of magnitude higher than the bulk of the p-type substrate.

Each programmable device includes a pair of spaced-apart n-type regions which define terminals of the device. A floating gate which in the presently preferred embodiment comprises an n-type polycrystalline silicon, is disposed above, and separated from, the channel formed between these n-type regions by a thermally grown oxide. One of such floating gates, gate 84, is illustrated in conjunction with device 86. Disposed above each floating gate is a second gate, or control gate, such as the gate associated with device 86 which is coupled to line 92. Again, in the presently preferred embodiment, the second gate or control gate comprises an n-type polycrystalline silicon.

These programmable devices exhibit a shift in threshold of approximately 8 to 10 volts when a charge exists on the floating gate. For the disclosed n-channel devices, the threshold becomes higher (more positive) when charge exists on the floating gate. For purposes of explanation, assume that a charge is to be placed on the floating gate 84 of device 86. In order to place the charge on the floating gate, a voltage of approximately 25 volts is applied to the control gate via line 92. This voltage is preferably applied in the form of a pulse or pulse train. Simultaneously, a voltage of approximately 20 volts is applied to line 97, while the other terminal of device 89 is coupled to ground through transistor 78. Thus, during programming as will be described in more detail, line 68 and the substrate are held at ground potential and transistor 78 conducts. When these conditions are met within device 86, a large depletion region exists beneath the inversion layer defining the n-channel between the spaced-apart n-type regions. Hot electrons from this depletion region are injected into the floating gate 84 and remain on the floating gate since this gate is completely surrounded by oxide. The charge on the floating gate may be neutralized by subjecting the device to ultraviolet radiation or devices which may be electrically erased may be employed. A window is provided in the package containing the filter to allow the filter to be subjected to ultraviolet radiation, thereby permitting reprogramming.

The output lines 97 and 98 are coupled to the input terminals of a differential amplifier 100, the output of this amplifier is shown as line 101. In the presently preferred embodiment the amplifier 100 (and the amplifiers associated with the other transfer means) are disposed on separate chips.

Figure 4:
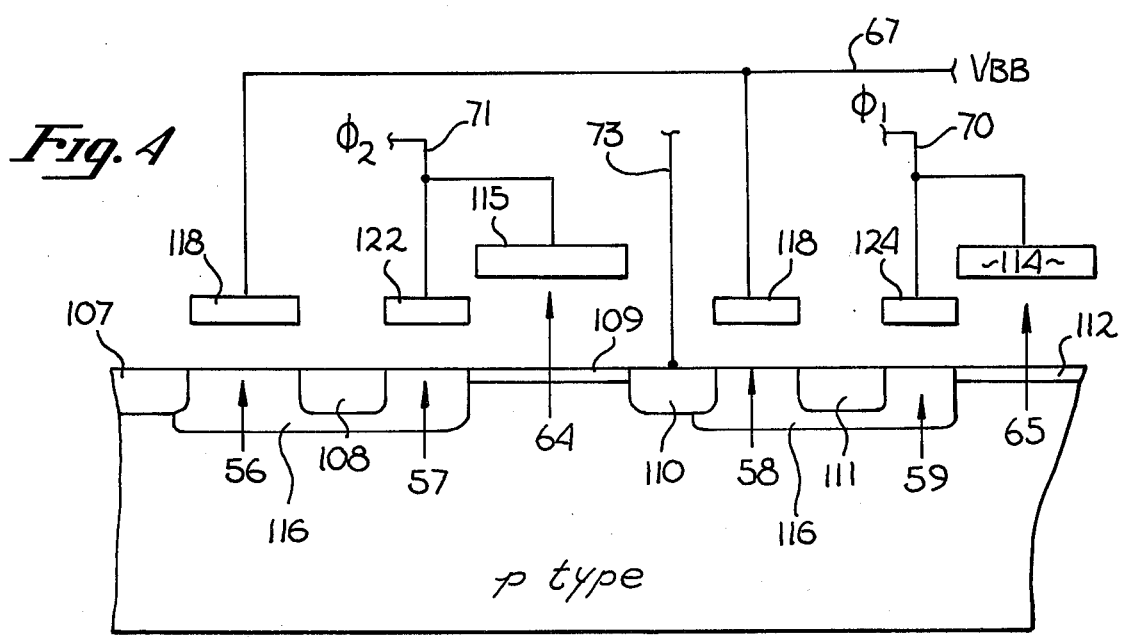
FIG. 4 is a cross-sectional, elevation view of a portion of the bucket-brigade charge transfer means of FIG. 3; this view is used to illustrate the two levels of polycrystalline silicon employed in the presently preferred embodiment.
Figure 5:
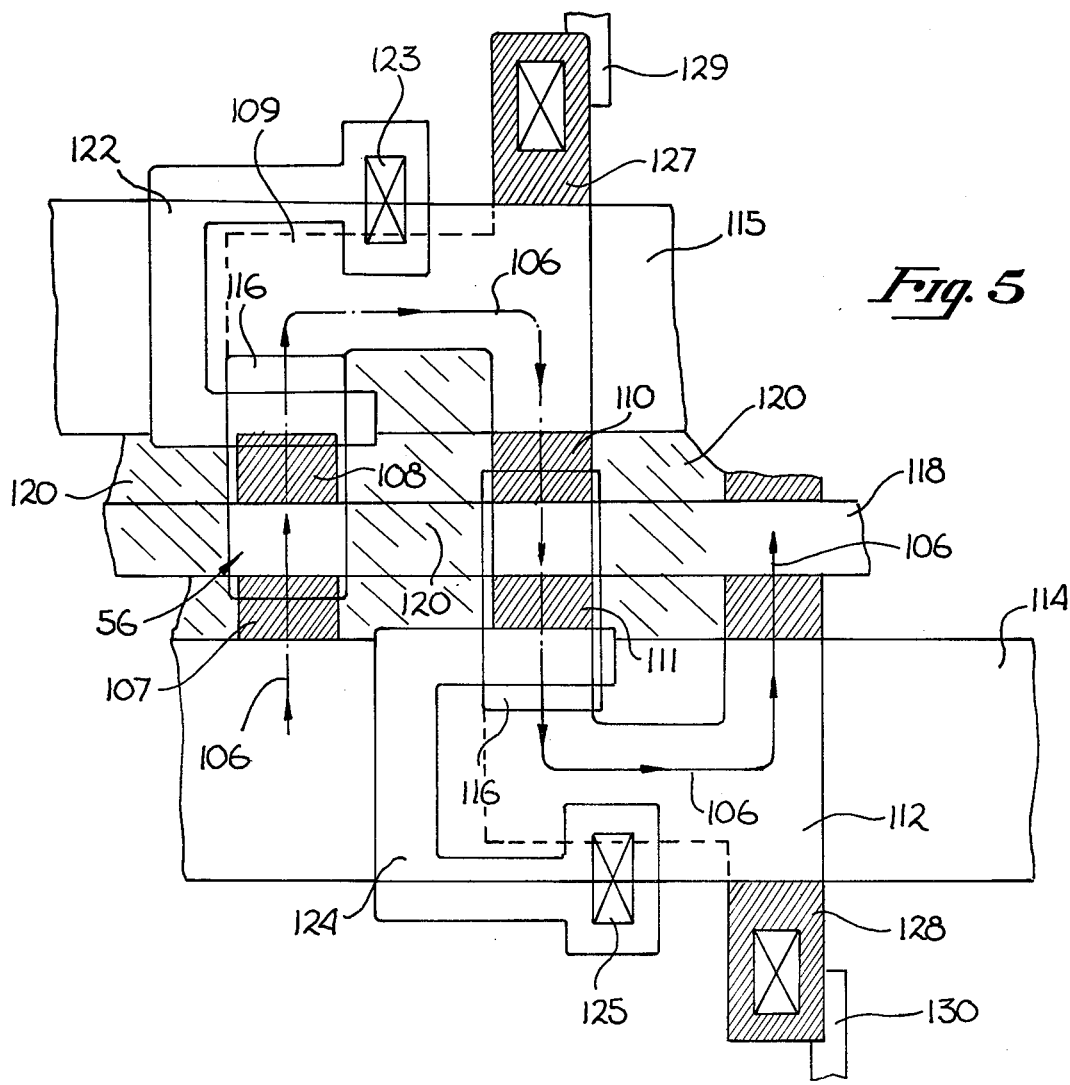
FIG. 5 is a plan view of a portion of the bucket-brigade charge transfer means of FIGS. 3 and 4 used to illustrate the manner in which the bucket-brigade is arranged as an integrated circuit.

Referring to FIGS. 4 and 5, the layout of the bucket-brigade transfer means on the substrate is illustrated. In FIG. 4, a p-type substrate is illustrated which includes transistors 56, 57, 58 and 59, and capacitors 64 and 65 of FIG. 3. The transistor 56 includes two n-type regions 107 and 108 and a gate shown as layer 118. The gate of transistor 57 is shown as layer 122, while the gate of transistor 59 is shown as layer 124. The capacitor 64 includes a layer 115 disposed above the lightly doped n-type region 109, while capacitor 65 includes a layer 114 which is disposed above the lightlly doped n-type region 112.

The substrate below gates 118, 122, and 124 is ion implanted with a p-type dopant (regions 116). Regions 116 form host regions for the regions 108 and 111 (FIG. 4). The regions 116 improve the charge transfer efficiency. (See "Performance Limitations of the IGEFT Bucket-Brigade Shift Register" by Berglund and Boll, IEEE Transactions on Electronic Devices, Vol. ED-19, No. 7, July 1972.) This ion implantation may be performed simultaneously with the formation of the host regions for the floating gate devices. However, as best seen in FIG. 4 the substrate regions below layers 114 and 115 are not ion implanted, thus regions 109 and 112 are formed in the lower doped substrate. This provides an ideal holding stage in that the junction capacitance between region 109 and the substrate (and like junctions) is much smaller than the capacitor 64 (layer 115 and region 109).

In the presently preferred embodiment, layers 118, 122 and 124 are disposed at approximately the same first level above the substrate and are separated from the substrate by thermally grown oxide. Layers 114 and 115 define a second level disposed above the first level which is insulated from the first level by oxide. The first level layers comprising layers 118, 122 and 124, and the second level layers comprising layers 114 and 115 are n-type polycrystalline silicon. An aluminum interconnecting level is disposed above the second level and used to define interconnections and terminal pads.

In the fabrication of the filters, after the first level layers have been defined by ordinary masking steps, the substrate is subjected to an n-type dopant. When this occurs, regions 107, 108, 109, 110, 111 and 112 are formed; however, the extent of doping in this step is relatively light. After the second level polycrystalline layer has been fabricated (that is, layers 114 and 115), the substrate is again subjected to an n-type dopant which further defines the n-type regions 107, 108, 110 and 111. However, since the layers 114 and 115 are disposed above regions 109 and 112, these regions do not receive the additional dopant, and thus remain more lightly doped than the other regions shown in FIG. 4.

In FIG. 5, the flow of charge in the bucket-brigade transfer means is illustrated by line 106. This charge flow is shown first entering region 107, then flowing into regions 108, 109, 110, 111 and 112. The layers 114 and 115 are elongated strips as shown in FIG. 4 and receive the timing signals coupled to lines 70 and 71. The first level layer 118 is an elongated strip disposed between, and parallel to, the spaced-apart strips forming layers 114 and 115. This layer is coupled to line 67 and receives the $V_{BB}$ potential. The gate of transistor 57 is a generally C-shaped gate layer 122 which is adjacent to (but above) the region 108. The charge after passing through region 108 under gate 122 then flows into region 109, this being the more lightly doped region. The well 123 allows a connection to be made between layer 122 and layer 115 in order to couple the gate of transistor 57 to the $\phi_2$ signal. The tap 73 illustrated in FIGS. 3 and 4 comprises a more heavily doped region 127 which is contiguous with the region 109. A finger 129 which defines the gates of transistors 78 and 79 of FIG. 3 is partially shown in FIG. 5; this finger is connected to region 127 through a well.

In a similar manner, transistor 59 includes a C-shaped gate layer 124 which is coupled to the layer 114 via well 125. Adjacent to region 112 is a more heavily doped region 128 which is connected to the partially illustrated finger 130. This finger defines the gates of transistors 80 and 81 of FIG. 3.

Ion-implanted channel stops in the substrate are ulilized to separate stages of the bucket-brigade; these stop regions are shown generally by the lined regions 120 in FIG. 5.

As previously mentioned, the bucket-brigade charge transfer means of FIG. 3 in one presently preferred embodiment is implemented with 8 parallel transfer means, each having 64 taps on a single silicon chip with the amplifiers, such as amplifier 100, of FIG. 3, external to the chip. The output pads of the chip are connected to amplifiers, such as amplifier 100, with the output from each of the amplifiers, such as line 101 of FIG. 3, being coupled to a weighting resistors, such as resistors 42, 43, 44 and 45 of FIG. 2. The output of these resistors is summed and coupled to an amplifier, such as amplifier 47 of FIG. 2.

Assume now that the filter which includes the bucket-brigade transfer means illustrated in FIG. 3 is to be programmed with a correlating signal or other function. First, the correlating signal or function for this embodiment, is converted to sixty-four samples, each sample of which includes an eight bit digital word. Note that since amplifier 100 of FIG. 3 includes a positive input terminal and a negative input terminal, and since there are two programmable devices associated with each tap, each sample of the correlating signal or other function may include an eight bit "positive" word or an eight bit "negative" word.

To program the programmable devices such as devices 86 through 91, inclusive, of FIG. 3, line 68 is coupled to ground, and the bucket-brigade transfer means is operated by applying the complementary timing signals to lines 70 and 71. A strong positive signal is applied to the input of the transfer means. This, in turn, causes all the readout transistors to conduct, such as transistors 78 through 83, inclusive. The conduction of these readout transistors couples one terminal of each of the programmable devices to ground through line 68. Assume further that the binary bit which is to be stored within device 86 is a binary zero indicating that device 86 is not to conduct when the filter is in operation. As mentioned, to prevent device 86 from conducting, a charge (electrons) must be injected into the floating gate 84. In order to accomplish this, first an appropriate signal is applied to decoder 103, which signal will activate line 92 with a positive potential of approximately 25 volts. This potential preferably is in the form of a pulse train or single pulse, as opposed to a DC potential. Simultaneously with the application of a potential to line 92 a potential of approximately 20 volts is applied to line 97. With these potentials, hot electrons will be injected from the substrate into the floating gate 84. Obviously, if device 87 is to have its floating gate charged, line 98 would be coupled to the positive potential of approximately 20 volts. In a similar manner, each of the programmable devices in the filter may be programmed. With reference briefly to FIG. 2, the most significant bits associated with the sixty-four samples of the correlating signal are programmed into the filter which is coupled to the resistor having the least resistance, such as filter 39. The bits of the correlating signal representing the least significant bits would be programmed into the filter coupled to the resistor having the greatest resistance, such as filter 36.

When the filter is used, positive potentials are applied to lines $V_{BB}$ and $V_{DD}$. The potential $V_{BB}$, line 67, is maintained at an equal or slightly lower potential than the peaks of the timing signals applied to lines 70 and 71. This facilitates transfer of charge from the holding stages of the bucket-brigade transfer means to the adjacent stages. While not illustrated, during operation, a potential of approximately five volts is applied to the control gates of all the programmable devices. For example, the potential of five volts is applied to lines 92, 93, 94, and all the other lines coupled to the control gates of the programmable devices. This potential causes those devices which do not have charged floating gates to conduct and prevents those devices which have been programmed from conducting. This potential is also low enough to prevent inadvertent programming, or slow programming, of any of the programmable devices.

Once the correlating signal or other function has been programmed into the filter, an analog input signal may be applied to the input terminals of the bucket-brigade transfer means. This input signal is applied to all eight (8) transfer means utilized in the described embodiment. Also, the appropriate timing signals are applied to lines 70 and 71, to cause the charge to be transferred along these bucket-brigade transfer means. The output signal from each of the differential amplifiers, such as amplifiers 100, is weighted with the circuit shown in FIG. 2 and summed on line 46. The output of amplifier 47 will be representative of the correlation between the input signal and the programmed correlating signal.

The filter in its presently preferred embodiment may be readily erased by subjecting the substrate to ultraviolet radiation, or electrically erasable devices may be employed. Thus, the filter may be re-programmed as many times as desired. As is apparent, the ability to reprogram the filter allows experimentation with a correlating signal or other program, and the determination of an optimum signal or function for a particular application. Once this correlating or other signal has been determined, a mask programmable or fusible link programmable filter may be desirable, particularly where large quantities are required. By way of example, in a mask programmable embodiment each of the programmable devices would be replaced with either an open connection or closed connection. The same result could be achieved through known fusible link techniques.

While in FIG. 2 the digital weighting is performed with a plurality of resistors at the output of each filter, other weighting circuits may be used. For example, resistors may be used at the inputs to the filters, or amplifiers may be used at the inputs or outputs of the filters. Moreover, the weighting means may be fabricated on the "chip" or substrate which includes the filters. This may be accomplished by capacitance weighting, which weighting would be performed by the first bucket of each transfer means. For example, the bucket associated with transistor 55 and capacitor 63 of FIG. 3 may be fabricated to accept, more (or less) of the input signal when compared to the first bucket of other transfer means. A combination of first bucket capacitance weighting and resistor weighting may be used. Since only one bucket of each transfer means requires capacitance weighting, the prior art problems associated with the capacitance weighting of each bucket in a transfer means are not encountered.

Figure 6:
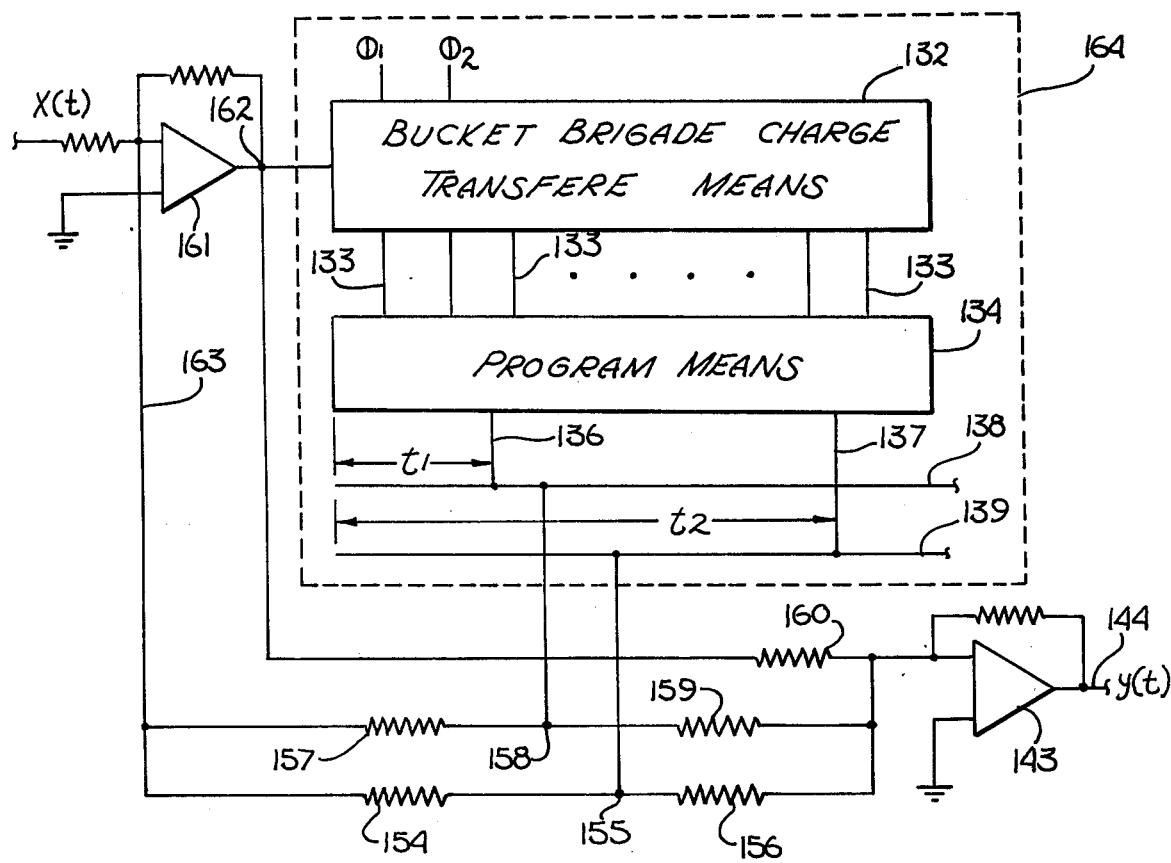
FIG. 6 is a block diagram illustrating the filter of FIG. 3 employed as a recursive filter; and, FIG. 7 is a block diagram illustrating a time varying filtering means employing a bucket-brigade charge transfer means.

The filter of FIG. 3 may also be employed as a recursive filter, as shown by the two-pole recursive filter of FIG. 6. The recursive filter of FIG. 6 includes a bucket-brigade charge transfer means 132 which may be the same as the transfer means of FIG. 3. The read-out taps of transfer means 132 are coupled to a programming means 134 by a plurality of lines 133. These taps correspond to the taps 73, 74 and 75 of FIG. 3.

The programming means 134 may be identical to the programming means employed with the apparatus of FIG. 3 which includes the floating gate devices and the read-out transistors, such as device 86 and transistor 78. The programming means selectively couples taps in the transfer means to lines 138 and 139. These lines correspond to lines 97 and 98 of FIG. 3. For purpose of explanation lines 136 and 137 are shown coupling the programming means to lines 138 and 139, respectively. Lines 136 and 137 are used to graphically illustrate that programming means 134 has been programmed such that two spaced-apart taps along transfer means 134 are coupled to lines 138 and 139. The other lines which are coupled to non-conducting floating gate devices are not shown in FIG. 6.

The delayed signal on line 138 is coupled to node 158 and the delayed signal on line 139 is coupled to node 155. Node 158 is coupled to the input 163 of amplifier 161 through resistor 157 and to the input of amplifier 143 through resistor 159. Similarly node 155 is coupled to the input of amplifier 161 via resistor 154 and to the input of amplifier 143 through resistor 156. The output of amplifier 161 (node 162) which includes the X(t) signal is coupled to the input of transfer means 132 and to the input of amplifier 143 via resistor 160.

The signal on line 136 is delayed by a predetermined period $t_1$, by the transfer means 132. Similarly the signal present on line 137 is delayed by a predetermined period $t_2$. The length of these delay periods may be controlled by the timing signals $\phi_1$ and $\phi_2$ and by the tap selection. By selection of $t_1$ and $t_2$ and the resistors of FIG. 6, each filter may thus be employed as a recursive filter. For a discussion of a related recursive filter employing a variable clock signal see "Programmable Bandpass Filter and Tone Generator Using Bucket-Brigade Delay Lines", by Smith, Bulter & Puckette, *IEEE Transactions on Circuits and Systems,* July 1974.

Figure 7:
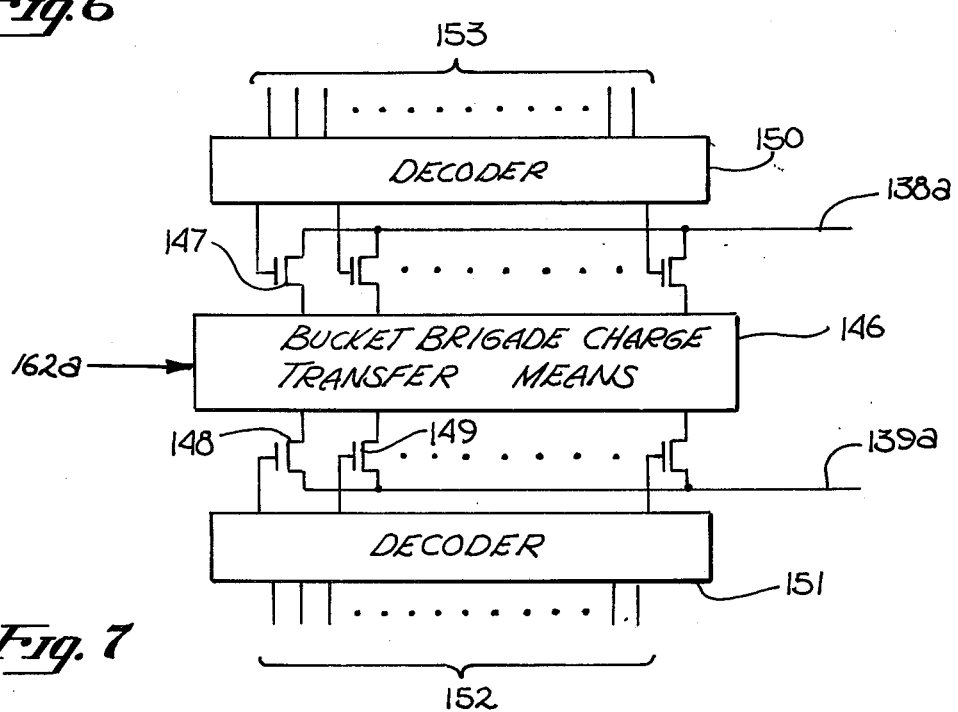

In FIG. 7 a bucket-brigade charge transfer means 146, which may be similar to the above described transfer means is shown. The taps of this transfer means are coupled to transistors, such as transistors 147, 148 and 149 for non-destructive reading on lines 138a and 139a, in the same manner that transistors 25a, 25b, etc. are coupled to transfer means 18 of FIG. 1.

The gates of transistors 148 and 149, and the like gates, are coupled to decoder 151 such that the decoder 151 may selectively couple the read-out taps of transfer means 146 to line 139a. Similarly the gates of transistor 147, and the like gates, are coupled to decoder 150 such that the decoder 150 may selectively couple the read-out taps of transfer means 146 to line 138a. The decoders 150 and 151 may be an ordinary decoders for decoding digital signals sensed on lines 152 and 153, respectively and for then activating the selected transistor, such as transistors 147, 148 or 149.

The apparatus of FIG. 7 may replace that portion of the circuitry shown within dotted line 164 of FIG. 6. Note lines 138a and 139b of FIG. 7 would be coupled to lines 138 and 139, respectively of FIG. 6, and line 162a of FIG. 7 would be coupled to node 162 of FIG. 6. By the application of appropriate signals to lines 152 and 153 a time varying recursive filter is obtained.

Thus, a semiconductor filter has been disclosed which may be substantially fabricated on a single substrate or chip employing known MOS technology. The filter which may be employed as a transversal or recursive filter, may be electrically programmed, and re-programmed. The filter does not exhibit many of the problems associated with the prior art semiconductor filters.

I claim:

1. A bucket-brigade charge transfer means disposed on a silicon substrate of a first conductivity type, said transfer means including a plurality of stages each comprising:

a first and a second spaced apart region of a second conductivity type, each having a p-n junction and being disposed in said substrate;

a third region of said second conductivity type disposed in said substrate spaced apart from said first and second regions, said third region being more lightly doped than said first and second regions;

a first gate disposed above and generally between said first and second regions;

a second gate disposed above and generally between said second and third regions;

a member disposed generally above said third region, said member coupled to said second gate, said member and third region forming a capacitance means;

a fourth region, disposed in said substrate below said first and second gates, which fourth region completely surrounds the p-n junction of said second region, said fourth region being more heavily doped with a first conductivity type dopant than said substrate;

contact means for contacting a region in said substrate, said contact means contacting said first to permit sensing of charge in said regions;

whereby, by the application of potentials to said first and second gates, charge may be transferred in said bucket-brigade charge transfer means.

2. The bucket-brigade charge transfer means defined by claim 1 including means for coupling said second gates of first alternate stages of said transfer means to a first timing signal and means for coupling said second gates of second alternate stages of said transfer means to a second timing signal.

3. The bucket-brigade charge transfer means defined by claim 2 including means for coupling said first gates of each of said stages to a source of potential.

4. The bucket-brigade charge transfer means defined by claim 1 wherein said first conductivity type is p-type.

5. The bucket-brigade charge transfer means defined by claim 4 wherein in each stage said first and second gates comprise polycrystalline silicon disposed at a first level above said substrate and wherein said member comprises polycrystalline silicon disposed at a second level above said substrate, said second level being above said first level.

* * * * *

UNITED STATES PATENT AND TRADEMARK OFFICE
CERTIFICATE OF CORRECTION

PATENT NO. : 4,157,558
DATED : June 5, 1979
INVENTOR(S) : Gene P. Weckler

It is certified that error appears in the above–identified patent and that said Letters Patent are hereby corrected as shown below:

| COLUMN | LINE | DESCRIPTION |
|---|---|---|
| 7 | 39 | Delete "IGEFT" and insert in lieu thereof --IGFET--. |
| 12 | 23 | Insert the word --region-- following the word "first". |

Signed and Sealed this

Twenty-third Day of October 1979

[SEAL]

Attest:

RUTH C. MASON
Attesting Officer

LUTRELLE F. PARKER
Acting Commissioner of Patents and Trademarks